US011221794B2

(12) United States Patent
Bronson et al.

(10) Patent No.: US 11,221,794 B2
(45) Date of Patent: Jan. 11, 2022

(54) MEMORY ARRAY ELEMENT SPARING

(71) Applicant: INTERNATIONAL BUSINESS MACHINES CORPORATION, Armonk, NY (US)

(72) Inventors: Tim Bronson, Round Rock, TX (US); Hieu T. Huynh, Austin, TX (US); Kenneth Klapproth, Travis, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/280,577

(22) Filed: Feb. 20, 2019

(65) Prior Publication Data
US 2020/0264803 A1    Aug. 20, 2020

(51) Int. Cl.
     *G06F 3/06*          (2006.01)
     *G06F 12/0895*      (2016.01)

(52) U.S. Cl.
CPC .......... *G06F 3/0659* (2013.01); *G06F 3/0619* (2013.01); *G06F 3/0683* (2013.01); *G06F 12/0895* (2013.01); *G06F 2212/1032* (2013.01); *G06F 2212/608* (2013.01)

(58) Field of Classification Search
CPC .... G06F 3/0659; G06F 3/0619; G06F 3/0683; G06F 12/0895; G06F 2212/1032; G06F 2212/608
See application file for complete search history.

(56) References Cited

U.S. PATENT DOCUMENTS

| | | | | | |
|---|---|---|---|---|---|
| 4,908,798 | A | * | 3/1990 | Urai ...................... | G11C 29/848 365/185.09 |
| 5,574,729 | A | * | 11/1996 | Kinoshita ............ | G11C 29/848 714/711 |
| 5,742,556 | A | * | 4/1998 | Tavrow ................ | G11C 29/802 365/225.7 |

(Continued)

OTHER PUBLICATIONS

Cho et al.,"A Survey of Repair Analysis Algorithms for Memories" ACM Computing Surveys (CSUR), Oct. 2016. vol. 49 Issue 3, Dec. 2016, Article No. 47. 41 pages. DOI: http://dx.doi.org/10.1145/2971481.

(Continued)

*Primary Examiner* — Andrew J Cheong
(74) *Attorney, Agent, or Firm* — Cantor Colburn LLP; Margaret McNamara

(57) ABSTRACT

Methods, systems and computer program products for providing access to a spare memory array element ("MAE") are provided. Aspects include storing a row number a column number associated with a defective MAE of a plurality of MAEs. The plurality of MAEs are logically arranged in a plurality of rows and a plurality of columns. Aspects also include receiving a command to access a cache line. The cache line corresponds to a selected row of MAEs of the plurality of MAEs. Responsive to determining that the selected row matches the row number that is associated with the defective MAE, aspects include activating one or more column shifters to prevent access to the defective MAE and provide access to a spare MAE when accessing the cache line. The activation of the one of more column shifters is based on the column number that is associated with the defective MAE.

20 Claims, 7 Drawing Sheets

(56) References Cited

U.S. PATENT DOCUMENTS

| | | | |
|---|---|---|---|
| 6,408,401 B1 | 6/2002 | Bhavsar | |
| 6,765,832 B1* | 7/2004 | Ohtani | G11C 11/4085 |
| | | | 365/185.23 |
| 6,876,557 B2 | 4/2005 | Hsu | |
| 6,928,377 B2 | 8/2005 | Eustis | |
| 7,702,972 B2 | 4/2010 | Bronson | |
| 8,358,548 B2 | 1/2013 | Manna | |
| 8,402,326 B2 | 3/2013 | Singh | |
| 8,468,419 B2 | 6/2013 | Dudeck | |
| 8,724,423 B1 | 5/2014 | Zhou | |
| 9,396,815 B2 | 7/2016 | O'Connell | |
| 2001/0002176 A1* | 5/2001 | Ooishi | G11C 7/1006 |
| | | | 365/189.02 |
| 2001/0028584 A1* | 10/2001 | Nakayama | G11C 29/24 |
| | | | 365/203 |
| 2007/0030742 A1* | 2/2007 | Lunde | G11C 29/81 |
| | | | 365/200 |
| 2009/0067269 A1* | 3/2009 | Wissel | G11C 29/848 |
| | | | 365/200 |
| 2010/0128541 A1* | 5/2010 | Russell | G11C 5/147 |
| | | | 365/189.011 |
| 2013/0007544 A1* | 1/2013 | Nemazie | G11C 29/808 |
| | | | 714/723 |
| 2018/0196709 A1 | 7/2018 | Das | |

OTHER PUBLICATIONS

Jun et al., "Recovering from Biased Distribution of Faulty Cells in Memory by Reorganizing Replacement Regions through Universal Hashing" ACM Transactions on Design Automation of Electronic Systems (TODAES), vol. 23 Issue 2, Jan. 2018, Article No. 16. 21 pages.

Namekawa et al., "Dynamically shift-switched dataline redundancy suitable for DRAM macro with wide data bus," IEEE Journal of Solid-State Circuits, May 2000, vol. 35, Issue: 5, pp. 705-712.

* cited by examiner

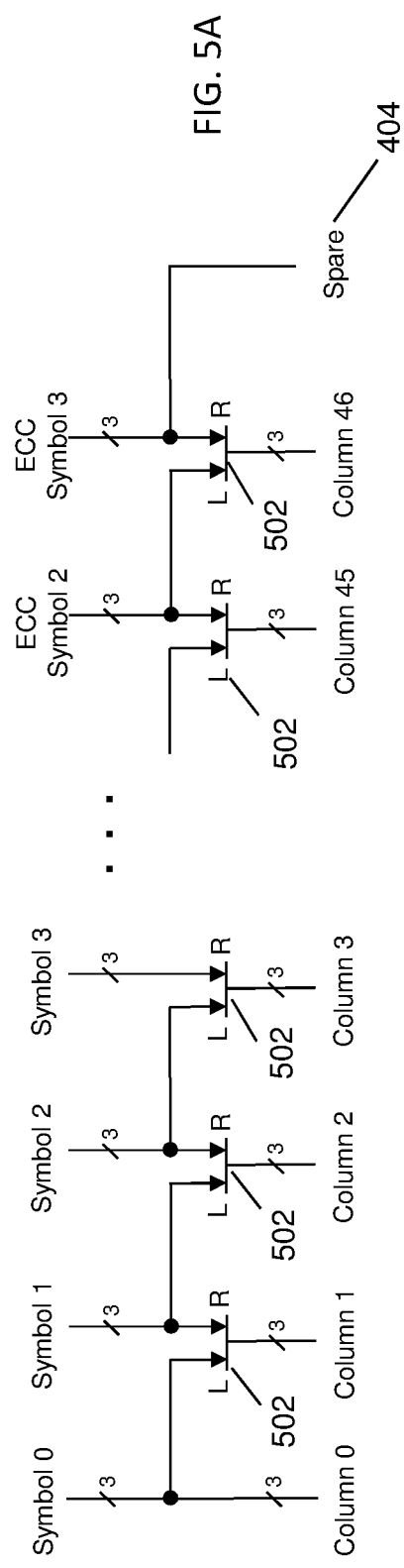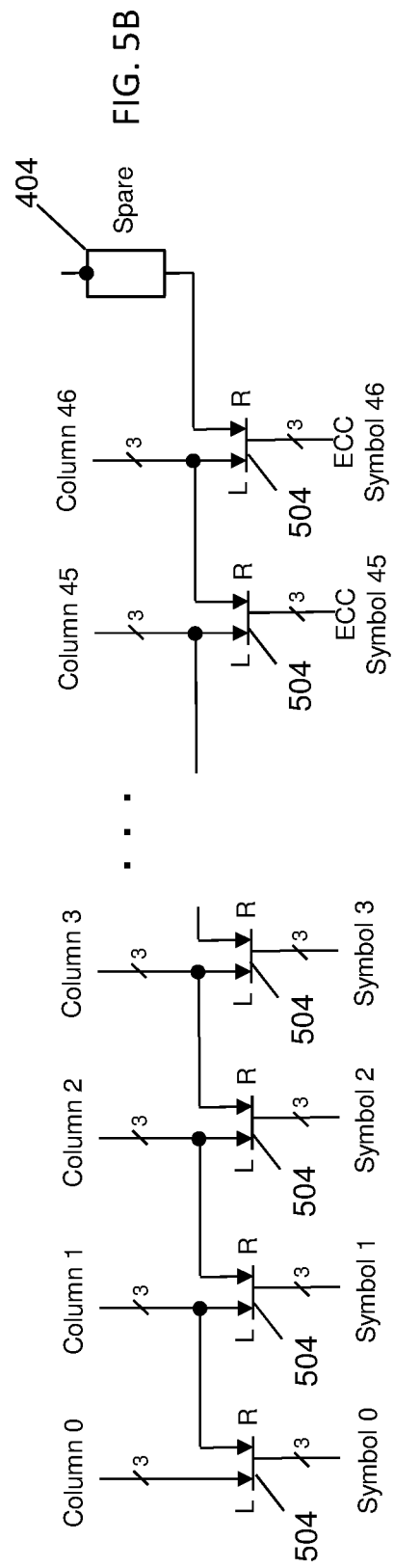

MEMORY ARRAY ELEMENT SPARING

BACKGROUND

The present invention generally relates to data processing, and more specifically, to providing access to a spare eDRAM.

Contemporary high-performance computer systems are typically implemented as multi-node, symmetric multiprocessing ('SMP') computers with many compute nodes. SMP is a multi-processor computer hardware architecture where two or more, typically many more, identical processors are connected to a single shared main memory and controlled by a single operating system. SMP computers may include one or more L4 caches that can include a plurality of memory elements, such as a bank of embedded dynamic random-access memories (eDRAMs), which may be organized as an array of logical columns and rows. If a particular memory element in an array is defective, it is generally necessary to repair the array in some manner or discontinue use of the array, which can result in a loss of memory capacity.

SUMMARY

Embodiments of the present invention are directed to a computer-implemented method for providing access to a spare memory array element. A non-limiting example of the computer-implemented method includes storing a row number and a column number that are associated with a defective memory array element of a plurality of memory array elements. The plurality of memory array elements are logically arranged in a plurality of rows and a plurality of columns. The method also includes receiving a command to access a cache line. The cache line corresponds to a selected row of memory array elements of the plurality of memory array elements. Responsive to determining that the selected row matches the row number that is associated with the defective memory array element, the method also includes activating one or more column shifters to prevent access to the defective memory array element and provide access to a spare memory array element when accessing the cache line. The activation of the one or more column shifters is based on the column number that is associated with the defective memory array element.

Embodiments of the present invention are directed to a system for providing access to a spare memory array element. The system includes a memory having computer readable computer instructions, and a processor for executing the computer readable instructions. The computer readable instructions include instructions for storing a row number and a column number that are associated with a defective memory array element of a plurality of memory array elements. The plurality of memory array elements are logically arranged in a plurality of rows and a plurality of columns. The computer readable instructions also include instructions for receiving a command to access a cache line. The cache line corresponds to a selected row of memory array elements of the plurality of memory array elements. Responsive to determining that the selected row matches the row number that is associated with the defective memory array element, the computer readable instructions also include instructions for activating one or more column shifters to prevent access to the defective memory array element and provide access to a spare memory array element when accessing the cache line. The activation of the one or more column shifters is based on the column number that is associated with the defective memory array element.

Embodiments of the invention are directed to a computer program product for providing access to a spare memory array element, the computer program product having a computer readable storage medium having program instructions embodied therewith. The computer readable storage medium is not a transitory signal per se. The program instructions are executable by a processor to cause the processor to perform a method. A non-limiting example of the method includes storing a row number and a column number that are associated with a defective memory array element of a plurality of memory array elements. The plurality of memory array elements are logically arranged in a plurality of rows and a plurality of columns. The method also includes receiving a command to access a cache line. The cache line corresponds to a selected row of memory array elements of the plurality of memory array elements. Responsive to determining that the selected row matches the row number that is associated with the defective memory array element, the method also includes activating one or more column shifters to prevent access to the defective memory array element and provide access to a spare memory array element when accessing the cache line. The activation of the one or more column shifters is based on the column number that is associated with the defective memory array element.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5A depicts example column shifters for cache eDRAM store data according to one or more embodiments of the invention;

FIG. 5B depicts example column shifters for cache eDRAM fetch data according to one or more embodiments of the invention.

Figure 1:
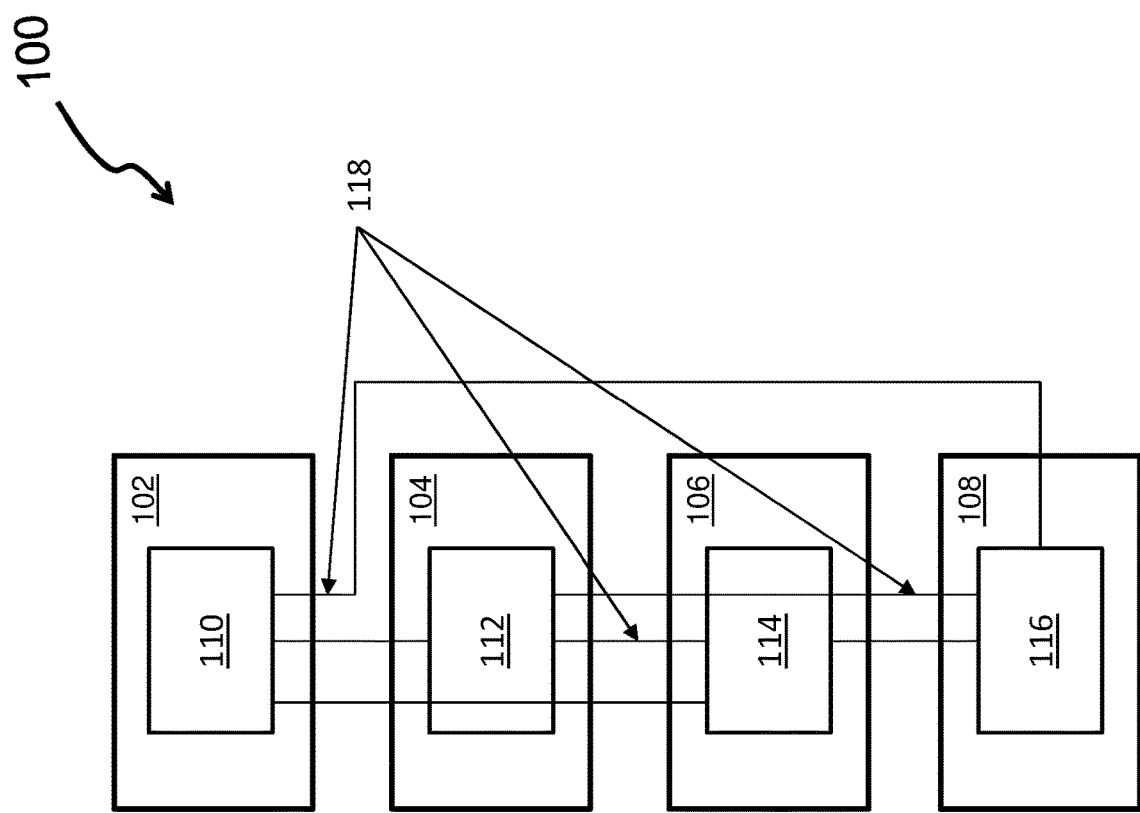
FIG. 1 depicts a block diagram of a distributed symmetric multiprocessing (SMP) system in accordance with one or more embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is well known that redundancy in regular structures such as arrays of memory elements improves the manufacturing yield of computer chips when defective elements can be selectively replaced by available redundant elements. It has also been established that redundancy of entire array instances can further improve yield as compared to redundancy only of elements within each array instance. The benefits of adding redundant (i.e., spare) array instances typically comes at a high price in terms of limited chip resources. Conventionally, it is necessary to add multiple spare array instances per group of arrays to limit wiring and selection resources. For example, adding a column of spare arrays with one spare per row of array instances requires far less wire and selection resources than adding a single spare to the same group. This solution, however, requires more area and power than might otherwise be necessary for desired yield improvement due to the increased number of spare instances. Due to the tradeoff of area and power against excessive wiring, prior computer systems resort to masking off (i.e., marking as unusable) portions of arrays or even rows of arrays when internal array redundancy is insufficient to replace defects. This solution is not resource intensive, but improves yield at the expense of reduced capacity and reduced performance. Embodiments of the present invention address this problem by incorporating a plurality of column shifters into an array that allow for the use of a single spare array element to remedy a defective array element. This solution requires minimal extra wiring and switching resources, thereby dramatically improving yield with no loss in capacity or performance. Further, in addition to utilizing spares to remedy defective arrays during system testing, these spares can also be activated under firmware control to effectively repair defects that develop after the system has been shipped. Such repairs can be completed without powering down the system or stopping the execution of applications, thereby also providing significant improvements to reliability. Although this disclosure generally describes the use of a spare eDRAM to repair a plurality of eDRAMs, the techniques described herein may be applied to other types of array elements, such as dynamic random-access memory (DRAM) elements, static random-access memory (SRAM) elements, and embedded static random-access memory (eSRAM) elements. Accordingly, as used herein, the term "memory array element" can alternatively refer to an eDRAM, a DRAM, an SRAM or an eSRAM.

Turning now to an overview of technologies that are more specifically relevant to aspects of the invention, in modern multi-processor computer systems, a hierarchy of caches is used to buffer memory cache lines in order to reduce the access time overhead of data in memory. Highly distributed, large symmetric multiprocessing (SMP) systems can share high-level cache (e.g., IA cache). Prior SMP systems required tradeoffs to be made between the amount of available L4 cache and the level of connectivity between processors to accommodate cost and packaging constraints. Existing SMP systems can include multiple drawers, where each drawer contains two independent and separate nodes. These nodes in turn each contain multiple central processing (CP) chips (e.g., integrated circuits) connected together with a dedicated shared cache (SC) chip. Each CP chip is a chip multiprocessor (CMP) with a private L1 and L2 cache per processor and one L3 cache shared by all the processors on the chip. The SC chip includes an L4 cache and system interconnect logic.

Turning now to a more detailed description of aspects of the present invention, FIG. 1 depicts a distributed symmetric multiprocessing (SMP) system 100 (hereafter "system 100") in accordance with one or more embodiments. According to some embodiments, system 100 can include 4 processing units or "drawers." In some embodiments, system 100 can include 5 processing units or drawers. Each drawer of system 100 can connect to the other drawers of the system 100. For example, as shown in FIG. 1, drawer 102 (described in greater detail with respect to FIG. 2) connects to drawer 104, drawer 106, and drawer 108 via a shared cache (SC) chip (sometimes referred to as an integrated circuit (IC)) 110. Drawers 104, 106, and 108 each have a respective SC chip (e.g., SC chip 112, SC chip 114, SC chip 116). Bus lines 118 connect drawers 102, 104, 106, and 108. Intra-drawer coherency communication may be performed using pass-through and a combination of these bus-lines, 118.

In an embodiment, cache lines that are owned or shared by processors of an entity at a level of coherency (cluster, CP Chip, drawer) are candidates to be handled at the level of coherency. Thus, if a processor of the entity requests ownership or sharing of a line that is already owned by a processor of the same entity (e.g., CP Chip or drawer), the entity need not access other entities to handle the request coherently. A request, for example, by a processor of a CP chip within a CP cluster, for sharing of a cache line is examined by memory controller function to determine if the line is owned or shared by a processor of CP cluster. If it is already owned or shared, the memory controller handles the request within the CP cluster without accessing any other CP clusters. If the line is neither owned nor shared by a processor of CP cluster, the memory controller of the initial CP Cluster performs a cache coherency operation with the other CP chips on the other CP clusters connected to that SC chip or on the other drawers via the SC chips on those drawers.

Figure 2:
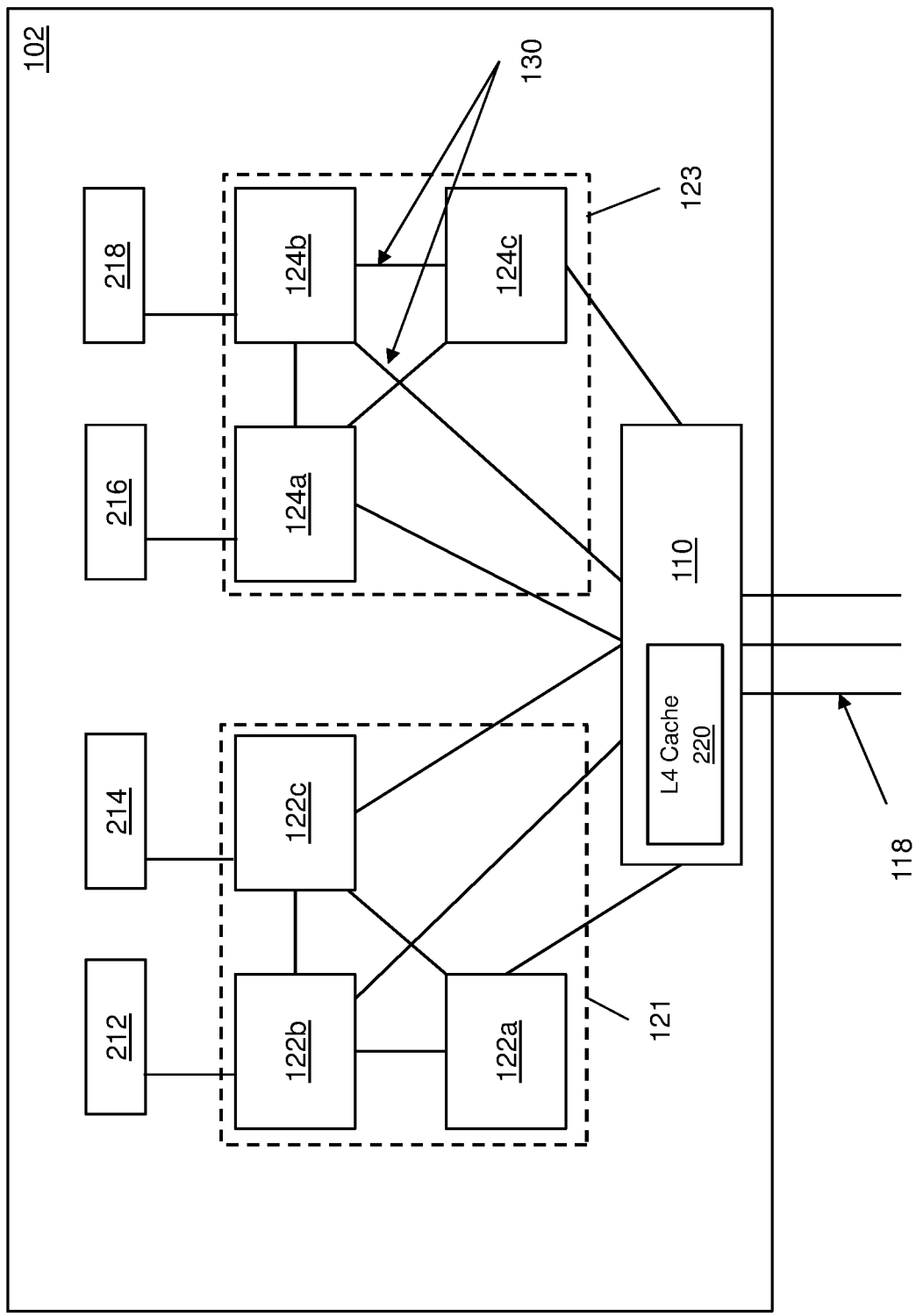
FIG. 2 depicts a block diagram of a drawer in a distributed symmetric multiprocessing (SMP) system in accordance with one or more embodiments of the invention.

FIG. 2 depicts drawer 102 in greater detail, according to one or more embodiments. Although FIG. 2 depicts only drawer 102, it should be appreciated that a similar configuration is contemplated for drawers 104, 106, and 108, and/or other drawers in system 100. Referring now to FIG. 2, drawer 102 includes two CP clusters (e.g., CP cluster 121 and CP cluster 123). Each CP cluster contains individual CP chips. For example, CP cluster 121 contains CP chips 122a, 122b, and 122c; and CP cluster 123 contains CP chips 124a, 124b, and 124c. Each of the individual CP chips (e.g., CP chips 122a, 122b, 122c, 124a, 124b, 124c) has multiple processing cores (e.g., 2 processing cores, 8 processing cores, 10 processing cores, etc.) and each processing core has its own private L1 and L2 cache. The processing cores within each individual CP chip share an L3 cache at the CP level. For example, the CP 122a includes multiple processing cores that each has its own L1/L2 cache and the multiple processing cores within the CP 121 share an L3 cache. Each respective CP chip may be connected to system memory (e.g., system memory 212, system memory 214, system memory 216, and system memory 218). CP chip 121 is operatively connected with each of the other clusters (e.g., 123) via bus lines 130 through the SC chip 110. In other aspects, a CP cluster may include any number of CP chips, although embodiments are described as having only three.

The SC chip 110 includes interconnects for communication with each CP chip (e.g., CP chips 122a, 122b, 122c, 124a, 124b, 124c) in both clusters 121, 123 on the drawer 102 and for communication with other SC chips on other drawers (e.g., the SC 112 of the drawer 104, the SC 114 of the drawer 106, the SC 116 of the drawer 108, etc.). In one or more embodiments of the invention, the SC chip 110 includes an L4 cache 220 and directory that includes the L4 cache and a directory of the state bits.

Figure 3:
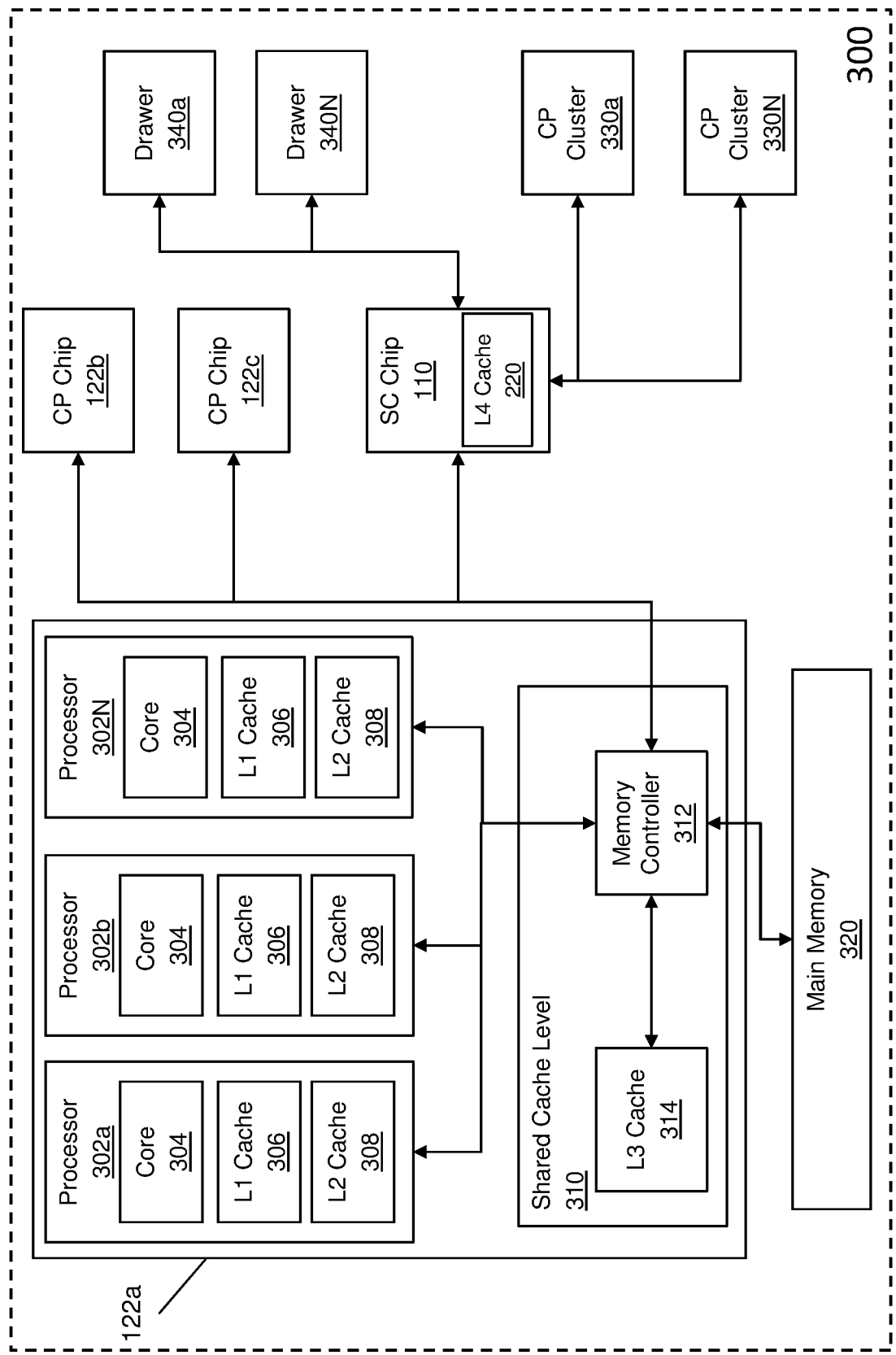
FIG. 3 depicts a block diagram of an exemplary symmetric multiprocessor (SMP) computer according to one or more embodiments of the invention.

FIG. 3 depicts a block diagram of an exemplary symmetric multiprocessor (SMP) computer according to one or more embodiments of the present invention. The system 300 includes several CP clusters 330a-330N (where N is any whole number greater than 2) which may be directly connected or connected through other SC chips. As described in FIG. 2, each CP cluster includes three CP chips. CP chip 122a is depicted in greater detail in FIG. 3. CP chip 122a includes processors 302a-302N (where N is any whole number greater than 2). Each processor has one or more cores 304, an L1 cache 306, and an L2 cache 308. Each processor within the CP chip 122a is communicatively coupled to a memory controller 312 on a shared cache level 310. The memory controller 312 can access the L3 cache 314. In one or more embodiments, each of the processors 302a-302N share the L3 cache on the CP chip 122a. The memory controller 312 with the L3 cache implements a shared cache level 310 across a CP cluster in the system 300.

The main memory 320 can include a random access store of program data and program instructions for data processing on the system 300. Main memory 320 is characterized by memory latency, the time required for a memory access, a read or write to or from main memory.

The L1 cache 306 and L2 cache 308 along with the L3 cache 314 are specialized segments of memory used by the processors 302a-302N to reduce memory access latency. Each cache, including L4 cache 220, is smaller and faster than main memory 320, and each cache stores copies of data from frequently used main memory locations. When a processor needs to read from or write to a location in memory, it first checks whether a copy of that data, a "cache line," is in a cache.

In the examples of FIG. 3, when a processor 302a on CP chip 122a in CP cluster 121 (from FIG. 2) experiences a cache miss for a cache line in the L3 cache 314, which of course follows a cache miss on L1 306 and L2 308, the memory controller 312 broadcasts to the other CP chips 122b, 122c and the SC Chip 110 a coherency request for the cache line. The SC Chip 110 checks its L4 cache 220 and if necessary also looks to the other CP clusters 330a . . . 330N and the other drawers 340a . . . 340N check for the cache line in their respective L3 and L4 cache. If either of the CP chips 122b, 122c or the SC Chip 110 does have the line it will be returned from one of these locations. If neither the other CP chips 122b, 122c or the SC Chip 110 have the cache line, the SC chip 110 will initiate requests to the SC Chips on the other drawers 340a . . . 340N. If the cache line is not contained in any of the caches on any of the drawers, the memory controller 312 (on the drawer whose memory contains the line) will request the line from memory. If the memory containing the cache line is on any of the drawers 340a . . . 340N, the line is fetched from memory there, sent to the SC chip on that drawer, which forwards it to the SC chip on the drawer where the processor 302a fetch request originated. If the memory containing the cache line is on the same drawer where the processor 302a fetch request originated, the memory controller 312 retrieves the line from memory. In all scenarios where a line is fetched from memory, either locally 320 or from memory on a remote drawer 340a . . . 340N, the line is delivered to the requesting processor 302a and also installed in all levels of cache, L1, L2, L3, and L4 on the requesting drawer.

According to some embodiments, an L4 cache 220 may include, for example, 960 MB of cache data capacity that includes 3,776 2 Mb eDRAM macros per SC chip 110, organized as a 60-way set associative cache with 65,536 (64k) sets or congruence classes and 256 bytes per cache line. In some embodiments, each way of an n-way cache set may be referred to as a compartment. For example, a 60-way set associative cache can be said to have 60 compartments per set or congruence class. In some embodiments, an "eDRAM macro" may refer to a standardized eDRAM array instance that can be reused throughout the system. Throughout this disclosure, the terms eDRAM and eDRAM macro may be used interchangeably. As will be appreciated by those of skill in the art, an eDRAM is an embedded dynamic random-access memory (DRAM) that can be embedded on the same die or multi-chip module of an application-specific integrated circuit. According to some embodiments, each SC chip 110 may be divided into four quadrants, with 944 eDRAM macros per quadrant. In some embodiments, each quadrant may include four cache banks, and each cache bank may include 236 eDRAM macros. For example, FIG. 4A shows an example cache bank 400 having a plurality of 235 eDRAMs 402 and one spare eDRAM 404, for a total of 236 eDRAMs in the cache bank 400.

According to some embodiments, a cache bank 400 of an SC quadrant may include a plurality of eDRAMs 402 that are logically arranged into a number of columns and a number of rows. As will be understood by those of skill in the art, logical arrangement of eDRAMs 402 into a number of rows and columns mean that the eDRAMs 402 are not necessarily physically arranged into rows and columns within the L4 cache 220, but rather are connected and/or indexed in a manner that is representative of rows and columns. For example, as shown in FIG. 4A, in some embodiments, the plurality of eDRAMs 402 may be logically arranged into 5 rows and 47 columns. According to some embodiments, 4 of the 47 columns of eDRAMs 402 may be used for error checking (i.e., storing error correction code (ECC) symbols) whereas the other 43 columns may be used to store data. In some embodiments, each row of eDRAMs 402 may store a plurality of quad words using a number of eDRAMs of the row (e.g., data quad words may be stored by the first 43 columns of eDRAMs 402 of each row). Each data quad word may be 16 bytes of data that is made up of 43 3-bit symbols (e.g., 128 bits of data and 1 unused bit). According to some embodiments, a 3-bit symbol may be read out of each eDRAM 402 of a row to form a given data quad word. Thus, when fetching a data quad word, an entire row of eDRAMs 402 may be accessed, with a number of the eDRAMs 402 of the row (e.g., the last 4 eDRAMs) containing data that is used for error checking. A cache line may be made up of 16 data quad words. Thus, in some embodiments, if an instruction to fetch a cache line is issued by the system, the system may access a particular row of eDRAMs and read out 16 data quad words over 16 successive cycles.

According to some embodiments, each row of eDRAMs 402 may supply 12-way set associativity for a total of 60-way set associativity across 5 rows in a bank 400. According to some embodiments, each addressable internal row of an eDRAM macro, hereafter referred to as an eDRAM internal row, may contain a portion of one congruence class, such that an eDRAM internal row of 47 eDRAMs 402, may contain 12 compartments from one congruence class plus ECC protection, or put another way, each internal eDRAM row from a combined group or row of 47 eDRAMs 402 contains one 12-way set associative congruence class with ECC protection included. Thus, a single row of eDRAMs 402, with each eDRAM containing 4096 internal eDRAM rows, together contain 4096 sets or congruence classes with each set being 12-way set associative or each set having 12 compartments. Further, a bank 400 comprised of 5 rows of eDRAMs 402, contains 4096 sets or congruence classes with each set being 60-way set associative. In some embodiments, each SC chip 110 may include 64,536 (64k) congruence classes (i.e., 4,096 per bank*4 banks per quadrant*4 quadrants per chip) with each congruence class having 60 compartments or 60-way set associativity.

Figure 4A:
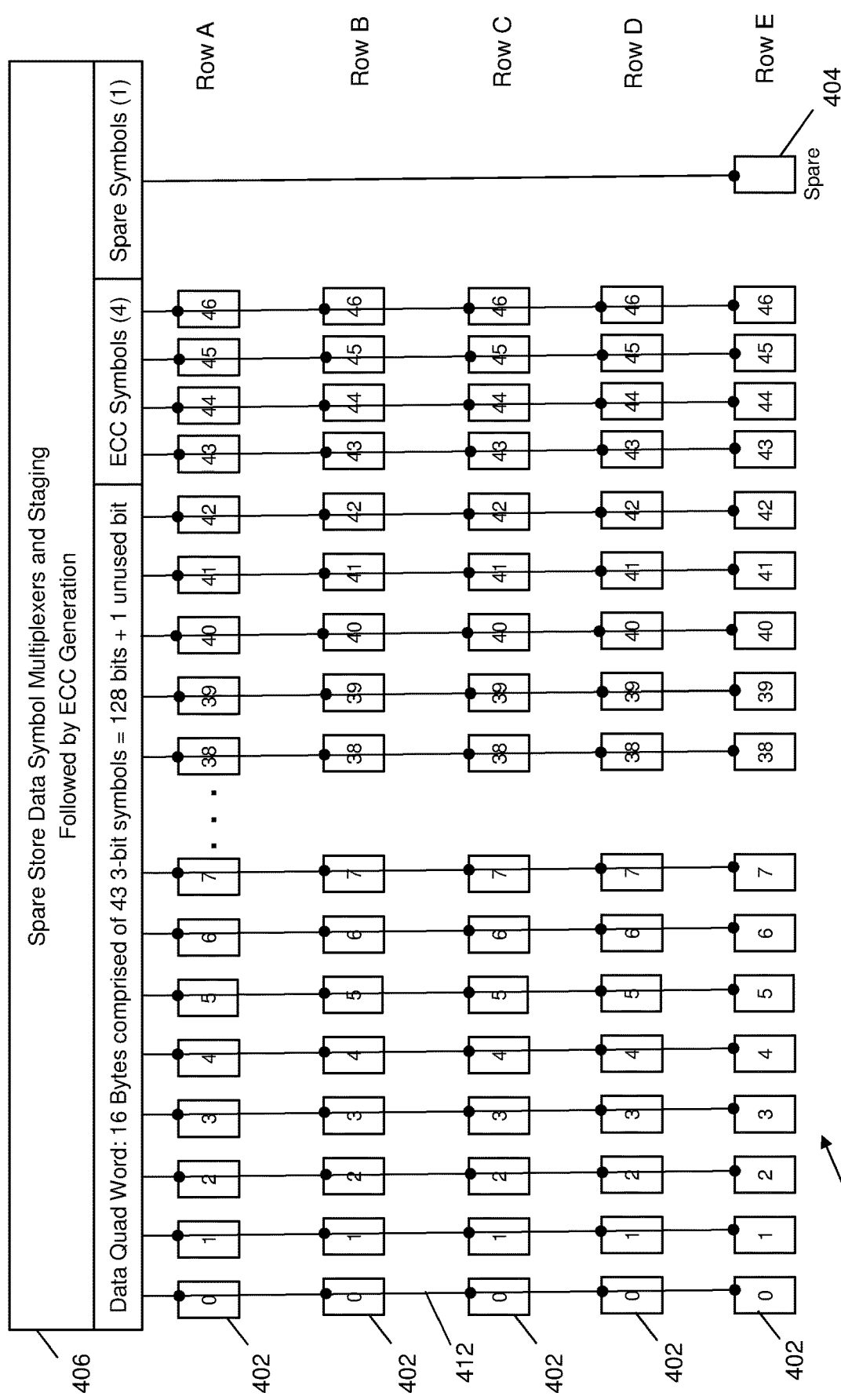
FIG. 4A depicts an example of a cache bank including store data paths for a plurality of eDRAMs and a spare eDRAM according to one or more embodiments of the invention.
Figure 4B:
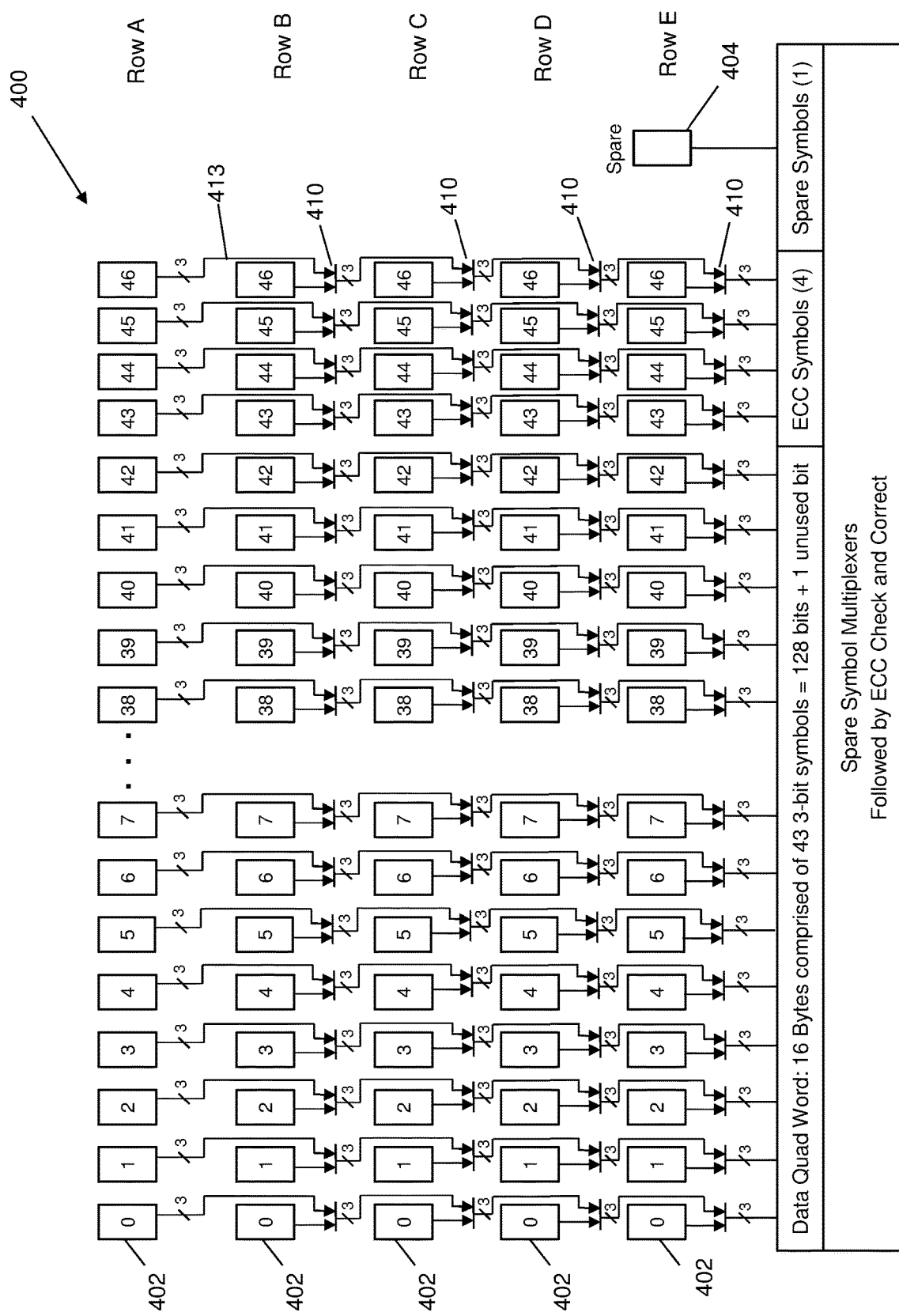
FIG. 4B depicts an example of cache bank including fetch data paths for a plurality of eDRAMs and a spare eDRAM according to one or more embodiments of the invention.

As shown in FIG. 4A, each column of eDRAMs 402, as well as the spare eDRAM 404, may be connected to staging and storage circuitry 406 that can be used to stage data (i.e., temporarily store data in latches or registers as necessary based on computer cycle-based physical limitations to data transmission), generate ECC protection symbols, and store data and ECC in the plurality of eDRAMs 402 as well as the spare eDRAM 404 in accordance with embodiments of the invention described herein. After staging, store data can be multi-dropped to each row in a cache bank 400, where selective write controls may be used to store data in the desired internal eDRAM row of the desired row (A, B, C, D, or E) of eDRAMs 402, where each row of eDRAMs 402 contains 12 of the total 60 associativity classes or compartments per bank 400. Not shown in FIG. 4A is a common address bus connected to every eDRAM 402 in each cache bank 400, where this address bus causes one of the 4096 internal eDRAM rows to be selected for access in each row of eDRAM's 402. As shown in FIG. 4B, according to some embodiments, each column of eDRAMs 402, as well as the spare eDRAM 404, may be connected to fetch and error correction circuitry 408 that can be used to fetch data from the plurality of eDRAMs 402, as well as the spare eDRAM 404, and perform error correction functionalities with respect to the data. According to some embodiments, cascading multiplexers 410 disposed between each row of eDRAMs may be used to selectively deliver fetch data from a desired internal eDRAM row of the desired row (A, B, C, D or E) of eDRAMs 402. For example, as shown in FIG. 4B, a first multiplexer 410 may receive the outputs of eDRAMs 402 in rows A and B as inputs, a second multiplexer 410 may receive the output of the first multiplexer 410 and the output of an eDRAM 402 in row C as inputs, a third multiplexer 410 may receive the output of the second multiplexer and the output of an eDRAM 402 in row D as inputs, and a fourth multiplexer 410 may receive the output of the third multiplexer 410 and an eDRAM 402 in row E as inputs and provide the output of the fourth multiplexer 410 as an input to the fetch and error correction circuitry 408. Not shown in FIG. 4B is a common address bus connected to every eDRAM 402 in each cache bank 400, where this address bus causes one of the 4096 internal eDRAM rows to be selected for access in each row of eDRAM's 402. As will be understood by those of skill in the art, the outputs of the fourth multiplexer 410 in each column of eDRAMs 402 may converge at the fetch and error correction circuitry 408, allowing an error-checked and corrected data quad word to be read out of the plurality of eDRAMs 402 as a plurality of 3-bit symbols.

As will be understood of those of skill in the art, although the eDRAMs 402 of each column of eDRAMs 402 are connected by a common fetch bus 413, during a fetching operation, only one row of a column is accessed. Thus, the row of an eDRAM 402 accessed pursuant to the execution of an instruction can impact whether or not eDRAM sparing is utilized during the execution of the instruction. According to embodiments of the present invention, if a particular eDRAM 402 is determined to be defective, in response to a store or fetch instruction calling for access to the row of the defective eDRAM 402, the system can selectively activate one or more column shifters 502, 504 to essentially displace the defective eDRAM 402 with the spare eDRAM 404 to allow uninterrupted operation of the cache bank 400. In this way, a single spare eDRAM 404 can serve to repair a defective eDRAM 402 without requiring the need of additional rows or columns of spare eDRAMs, which would require significantly more space and are likely to be underutilized if, for example, only a single eDRAM of an entire replacement row of eDRAMs is used to repair a single defective eDRAM (i.e., the unused eDRAMs of the replacement row are wasted). According to some embodiments, if a store or fetch instruction calls for access to a row that is not the same row as the defective eDRAM 402, the system may not activate any column shifters 502, 504, but may instead allow the fetch/store operation to execute as it would under normal conditions.

FIGS. 5A and 5B show example column shifters 502, 504 in accordance with embodiments of the invention that can be used for data storage and data fetching operations, respectively, to repair the cache bank 400 in a case where an eDRAM 402 of the plurality of eDRAMs 402 is determined to be defective. According to some embodiments, store column shifters 502 for use in association with storage operations may be integrated into the staging and storage circuitry 406 in a manner such that the column shifters can receive data or symbol inputs (e.g., retrieved from a processor, from memory, from an input/output device, etc.) at the staging and storage circuitry 406. As shown in FIG. 5A, each store column shifter 502 can have a first output path to a first column and a second output path to a second column that is adjacent to the first column. According to some embodiments, the number of store column shifters 502 may be one less than the number of columns of eDRAMs 402. In some embodiments, a store column shifter 502 may be a multiplexer that receives two inputs and selects one of the two inputs as an output based on a control signal received from a controller. Each store column shifter 502 can be selectively controlled by controller(s) or control logic included in each cache bank 400 to activate or deactivate a shifting function provided by the store column shifter 502. In some embodiments, such controllers or control logic may be included in the L4 cache 220. According to some embodiments, one of the inputs received by a store column shifter 502 can be from the same logical column as the output of the column shifter 502, and the second input can be from an adjacent column.

For example, as shown in FIG. 5A, a first store column shifter 502 having an output at Column 1 may receive inputs from Symbol 0 and Symbol 1, a second column shifter 502 having an output at Column 2 may receive inputs from Symbol 1 and Symbol 2, and so on. According to some embodiments, the default state of a store column shifter 502 is inactive, and when in an inactive state the store column shifter 502 will not provide a shifting function, but will instead allow an input symbol to pass through to the corresponding column for storage in an eDRAM 402 of the column. For example, when the store column shifter 502 having an output to Column 1 is in an inactive state, it will select Symbol 1 as the input to pass along to the output (i.e., selecting the R path). However, when a store column shifter 502 is switched to an active state, the store column shifter 502 will select the alternate input to pass through as an output. For example, when the store column shifter 502 having an output to Column 1 is in an active state, it will select the input received from Symbol 0 (i.e., selecting the L path) to pass along as the output to Column 1. In this way, the store column shifter can shift an input symbol that is logically input at a first column and shift it to be stored in an eDRAM of a logically adjacent second column. When the final store column shifter 502 of a row (i.e., the column shifter 502 having an output path to Column 46) is activated, it will cause the final input symbol (i.e., ECC Symbol 3) to be received by the spare eDRAM 404. In this way, a plurality of adjacent store column shifters 502 can be activated such that a plurality of adjacent input symbols are all shifted over by one column for storage in the adjacent column.

Thus, if for example, an eDRAM 402 in Column 39 of Row C has been determined to be defective (e.g., as determined during manufacturing/testing or as determined during operation of the system by error detection and thresholding logic), when an instruction calling for access to Row C is executed, a controller can activate a plurality of store column shifters 502 beginning with the column to the right of the column with the defective eDRAM 402, which in this case would be Column 40, and all of the remaining store column shifter 502 to the right of the first selected column shifter 502. In other words, the store column shifters 502 having outputs in Columns 40 through 46 would be activated such that the input Symbol 39 would be shifted to be stored in Column 40, the input Symbol 40 would be shifted to be stored in Column 41, and so on until the input Symbol 46 (i.e., ECC Symbol 3) would be shifted to be stored in the spare eDRAM 404. In this way, the system can associate the spare eDRAM 404 with the row of the defective eDRAM 402, and can essentially displace the defective eDRAM 402 with the spare eDRAM 404 by shifting each input beginning with the input of the column of the defective eDRAM 402 over to an adjacent column for storage. Thus, when for example, a cache line is being fetched from a row of the cache bank 400 that contains a defective eDRAM 402, the activated fetch columns shifters 504 can in effect cause the spare eDRAM 404 to be added to the row to displace the defective eDRAM 402, so that the cache line can be read out of a complete row of, for example, 47 eDRAMs.

According to some embodiments, fetch column shifters 504 for use in association with fetching operations may be integrated into fetch and error correction circuitry 408 in a manner such that the fetch column shifters can fetch symbols from eDRAMS 402 and output the symbols or data at the fetch and error correction circuitry 408 (e.g., to other drawers, to requesting L3 cache controllers on the same drawer, to memory, to an I/O device etc.). FIG. 5B provides an example embodiments of a plurality of fetch column shifters 504 that can be used in a similar manner to the store column shifters 502 in order to fetch data from eDRAMs 402 of adjacent columns such that fetching operations to a defective eDRAM 402 can be avoided. Similar to how activated store column shifters 502 shift input symbols to a column that is adjacent to the right of the subject column, as shown in FIG. 5B, activated fetch column shifters 504 cause data to be fetched from a column that is adjacent to the right of the subject column. According to some embodiments, when a fetch column shifter is in an inactive state, the fetch column shifter 504 will not provide a shifting function, but will instead fetch data (e.g., a symbol stored by an eDRAM 402) from a column corresponding to the output column of the fetch column shifter 504. For example, when the fetch column shifter 504 having an output of Symbol 0 is in an inactive state, it will select Column 0 as the input to pass along to the output (i.e., selecting the L path). However, when a fetch column shifter 504 is switched to an active state, the fetch column shifter will select the alternate input to pass through as an output. For example, when the fetch column shifter 504 having an output to Column 0 is in an active state, it will select the input received from Column 1 (i.e., selecting the R path) to pass along as the output to Symbol 0. According to embodiments of the invention, a plurality of logically adjacent fetch column shifters 504 can be activated by a controller such that a plurality of output symbols are fetched from adjacent rows in order to bypass an eDRAM 402 that has been determined to be defective.

For example, if an eDRAM 402 in Column 39 of Row C is determined to be defective, when an instruction calling for access to Row C is executed, a controller can activate a plurality of fetch column shifters 504 beginning with the fetch column shifter 504 that is in the same column as the defective eDRAM 402 (i.e., Column 39 in this case) and all of the fetch columns shifters 504 positioned to the right of that column. Thus, in this case, each of the fetch column shifters 504 from column 39 through column 46 would be activated (i.e., selecting the R path), such that each would fetch data from an eDRAM 402 in the adjacent column to the right, whereas all of the fetch column shifters 504 to the left of the column containing the defective eDRAM 402 would remain inactive (i.e., selecting the L path). Accordingly, the activated fetch column shifter 504 having an output to ECC Symbol 3 would fetch data from the spare eDRAM 404 in this case. In this way, the system can retrieve data from the row of eDRAMs 402 in a manner that bypasses the defective eDRAM 402 by essentially displacing it with the use of the spare eDRAM 404.

It should be understood that column shifting may only be applied when an instruction is executed that requires accessing the row containing the defective eDRAM 402. Thus, for example, if in the above cases, an instruction was executed that called for storing data in an eDRAM of Row B or fetching data from an eDRAM of Row D, then no column shifters 502, 504 would be activated, as the system can perform store and fetch operations in these rows as it would in a situation where there is no defective eDRAM 402. Thus, once an eDRAM 402 has been identified as being defective, the row and column numbers of the defective eDRAM 402 may be stored and utilized by controllers in determining whether to activate any column shifters and if so, which ones to activate. As illustrated by the examples described in relation to FIGS. 5A and 5B, according to some embodiments, one or more store column shifters having a column number greater than the column number of a defective eDRAM 402 may be activated to prevent access to the defective eDRAM 402 and provide access to the spare eDRAM 404. Similarly, in some embodiments, one or more fetch column shifters having a column number that is greater than or equal to the column number of the defective eDRAM 402 may be activated to prevent access to the defective eDRAM 402 an provide access to the spare eDRAM 404.

Figure 6:
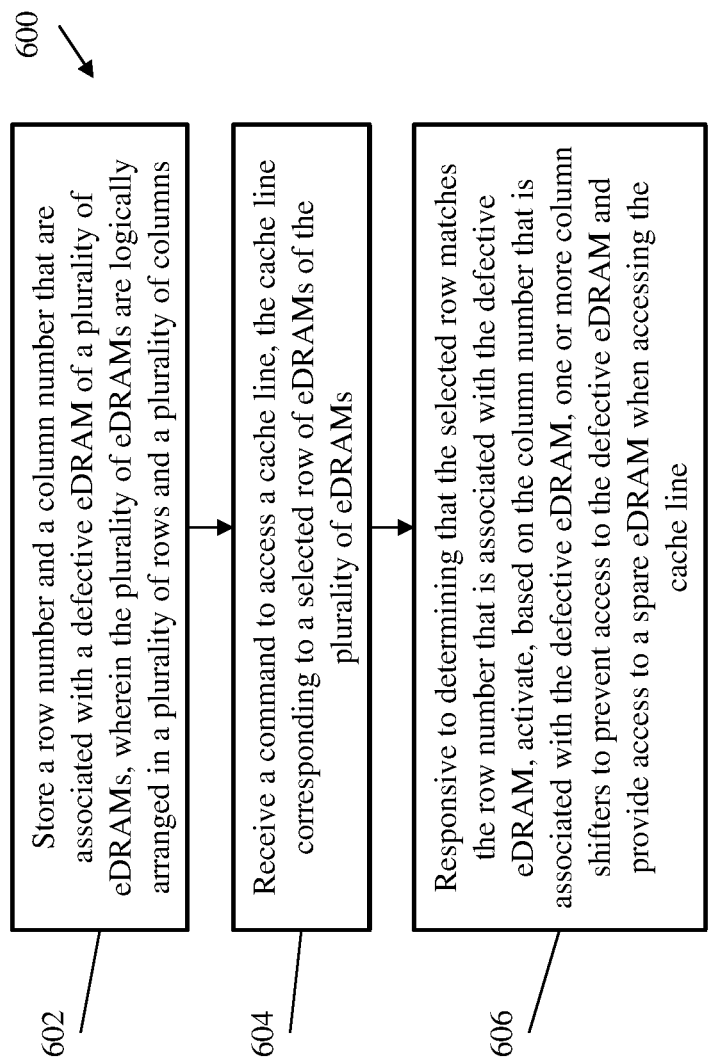
FIG. 6 depicts a flow diagram of a method for providing access to a spare eDRAM according to one or more embodiments of the invention.

Turning now to FIG. 6, a flow diagram of a method 600 for providing access to a spare eDRAM in accordance with an embodiment is shown. In one or more embodiments of the present invention, the method 600 may be embodied in hardware or software that is executed by computer elements that reside on a computer system or processing system, such as the system 300 described herein above and illustrated in FIG. 3, or in some other type of computing or processing environment. According to some embodiments, method 600 may be computer-implemented and may include control logic implemented as circuitry within the L4 cache 220.

The method 600 begins at block 602 and includes storing a row number and a column number that are associated with a defective eDRAM of a plurality of defective eDRAMs (e.g., eDRAMs 402). As will be appreciated by those of skill in the art, a system 300 may be configured to detect defective or inoperable eDRAMs 402 via conventional methods that track errors in the hardware (e.g., manufacturing testing, error detection performed by ECC logic of fetch and error correction circuitry 408, and other such methods). According to some embodiments, data stored in a failing location (i.e., a defective eDRAM) may be evicted to memory (e.g., main memory 320) to preserve the data for future use or relocation. According to some embodiments, the plurality of eDRAMs 402 can be logically arranged in a plurality of rows and a plurality of columns. In some embodiments, the plurality of eDRAMs 402 may include 235 eDRAMS 402, the plurality of rows may include 5 rows and the plurality of columns may include 47 columns, as is shown in for example, FIGS. 4A and 4B. According to some embodiments, the row and column numbers that are associated with the defective eDRAM can be stored in registers, such as a Row of Defective eDRAM (RDE) register and Column of Defective eDRAM (CDE) register, respectively. These registers may be specific to every cache bank 400 and can be contained within control logic (not shown) that is part of the cache bank 400 (e.g., in the L4 cache 220). The stored row number and column number may be accessed by one or more controllers that can use the stored row number and column number to determine whether to activate one or more column shifters 502, 504 and which column shifters 502, 504 to activate.

As shown at block 604, the method includes receiving a command to access a cache line. The cache line may correspond to a selected row of eDRAMs 402 the plurality of eDRAMs 402. The command may be, for example, a store command for storing data in cache associated with a row of the plurality of eDRAMs 402 or a fetch command for fetching data from a cache associated with a row of the plurality of eDRAMs 402. According to some embodiments, the L4 cache 220 may perform access operations based on store and fetch commands that result from instructions performed by a processor. For example, if an instruction executing in processor 302a references an operand that is not in its L1 cache 306, the cache controller there may request the cache line containing the operand from L2 cache 308. If the cache line is not present in L2 cache 308, the cache controller there may request the line from the shared L3 cache 314. If the cache line is not present in the L3 cache 314, the cache controller there (e.g., labeled as memory controller), may request the line from the L4 cache 220 in the SC chip 110. The cache controller in the L4 cache 220 may receive a cache line fetch request, which may be a command that is received over the bus connecting the SC chip 110 to the CP chip 122a. If the L4 cache 220 does not have the line, it may send commands to the other SC chips in the system to query their caches, which is likewise received by the other SC chips as a fetch command arriving over a bus.

As shown at block 606, the method includes, in response to determining that the selected row matches the row number that is associated with the defective eDRAM, activating one or more column shifters to prevent access to the defective eDRAM and provide access to a spare eDRAM when accessing the cache line. For example, the system may compare the selected row to the row of the defective eDRAM stored by the RDE register to determine if they are the same. If the RDE register is empty (i.e., no defective eDRAM of the bank 400 has been previously identified) or a row number other than row number associated with the selected row is stored by the register, then the system will determine that there is no match. According to some embodiments, during normal operation, every cache access operation may include accessing the RDE and CDE registers to determine if there is a defective eDRAM 402 and determine whether column shifting should be utilized. As previously described above, the activation of the one or more column shifters may be based on the column number that is associated with the defective eDRAM. In other words, the selection of how many and which column shifters are to be activated can depend on the column number stored by the CDE register.

In some embodiments, the spare eDRAM 404 provided in association with the plurality of eDRAMs 402 may be the only spare eDRAM 404 available for use in association with the plurality of eDRAMs 402. As described above, providing a single spare eDRAM 404 can provide significant savings in terms of available resources as compared with, for example, providing an entire column or row of spare eDRAMs.

As shown in FIGS. 5A and 5B, according to some embodiments, a column shifter (e.g., store column shifter 502 or fetch column shifter 504) may be a multiplexer configured to receive a first symbol provided by eDRAMs 402 of a first column of the plurality of columns and a second symbol provide by eDRAMs 402 of a second column of the plurality of columns. As shown, the second column is logically adjacent to the first column. According to some embodiments, the one or more column shifters 502, 504 can be dynamically controlled (i.e., selectively activated and deactivated) by control logic associated with bank 400 and/or plurality of eDRAMs 402 based on the selected row of eDRAMs 402 corresponding to the cache line and the stored row number and column number that are associated with a defective eDRAM 402. According to some embodiments, the one or more column shifters 502, 504 can be dynamically controlled (i.e., activated and deactivated) by one or more controllers of bank 400 based on the selected row of eDRAMs 402 corresponding to the cache line and the stored row number and column number that are associated with a defective eDRAM 402.

According to some embodiments, the command may be a store command and activating one or more column shifters to prevent access to the defective eDRAM 402 and provide access to the spare eDRAM 404 can include for each column of the plurality of columns, activating a store column shifter 502 associated with the column in response to determining that a number of the column is greater than the column number that is associated with the defective eDRAM 402. In some embodiments, the method may further include storing data in the spare eDRAM 404.

In some embodiments, the command may be a fetch command and activating one or more column shifters to prevent access to the defective eDRAM 402 and provide access to the spare eDRAM 404 includes for each column of the plurality of columns, activating a fetch column shifter 504 associated with the column in response to determining that a number of the column is greater than or equal to the column number that is associated with the defective eDRAM 402. In some embodiments, the method may further include fetching data from the spare eDRAM 404. According to some embodiments, when accessing a cache line for the purposes of either storing or fetching, one only internal eDRAM row (e.g., out of 4096 internal rows) is accessed within each eDRAM 402 of one of the rows of the plurality of eDRAMs 402 (e.g., one of rows A, B, C, D or E).

According to some embodiments, the method may further include receiving a different command to access a different cache line. The different cache line may correspond to a different row of eDRAMs 402 of the plurality of eDRAMs 402. In response to determining that the different row of eDRAMs does not match the row number that is associated with the defective eDRAM, the method may also include abstaining from activating any column shifters 502, 504. In other words, if a command to access a cache line references a cache line that is in a different row of eDRAMs 402 than the row number that is associated with the defective eDRAM (e.g., based on a comparison to the value stored by the CDE register), then the system may access the cache line in the row of eDRAMs 402 without utilizing any of the column shifters.

Additional processes may also be included. It should be understood that the processes depicted in FIG. 6 represent illustrations, and that other processes may be added or existing processes may be removed, modified, or rearranged without departing from the scope and spirit of the present disclosure.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
storing a row number and a column number that are associated with a defective memory array element of a plurality of memory array elements, wherein the plurality of memory array elements are logically arranged in a plurality of rows and a plurality of columns;
receiving a command to access a cache line, the cache line corresponding to a selected row of memory array elements of the plurality of memory array elements; and
responsive to determining that the selected row matches the row number that is associated with the defective memory array element, activating, based on the column number that is associated with the defective memory array element, one or more column shifters to prevent access to the defective memory array element and provide access to a spare memory array element while accessing the cache line, the one or more column shifters each having an output terminal to a corresponding inline column of the plurality of columns, the one or more column shifters being disposed between each of the plurality of rows in the plurality of memory array elements;
wherein, upon receipt of input storage data designated for an adjacent column of the plurality of columns and receipt of corresponding data for the corresponding inline column both of which occur during storage operations, the one or more column shifters sequentially shift the input storage data for storage away from the defective memory array element through one or more adjacent columns in the plurality of columns until reaching an associated column for the spare memory array element such that the input storage data designated for the adjacent column immediately prior to the spare memory element is shifted to and stored in the associated column for the spare memory array element;
wherein the spare memory array element is a single element, without requiring additional rows of spare memory array elements and without requiring additional columns of spare memory array elements, available for use in association with the plurality of memory array elements, the spare memory array element being connected to fetch and error correction circuitry.

2. The computer-implemented method of claim 1, wherein the command comprises a store command and activating the one or more column shifters to prevent access to the defective memory array element and provide access to the spare memory array element comprises:
for each column of the plurality of columns, activating a column shifter associated with the column in response to determining that a number of the column is greater than the column number that is associated with the defective memory array element.

3. The computer-implemented method of claim 2, further comprising storing data in the spare memory array element.

4. The computer-implemented method of claim 1, wherein the command comprises a fetch command and activating the one or more column shifters to prevent access to the defective memory array element and provide access to the spare memory array element comprises:
for each column of the plurality of columns, activating a column shifter associated with the column in response to determining that a number of the column is greater than or equal to the column number that is associated with the defective memory array element.

5. The computer-implemented method of claim 4, further comprising fetching data from the spare memory array element.

6. The computer-implemented method of claim 1, wherein the plurality of memory array elements comprises 235 memory array elements, the plurality of rows comprises 5 rows and the plurality of columns comprises 47 columns.

7. The computer-implemented method of claim 1, wherein the spare memory array element is logically structured outside the plurality of rows and the plurality of columns forming the plurality of memory array elements, such that the single element is configured to remedy the defective memory array element located anywhere in the plurality of memory array elements.

8. The computer-implemented method of claim 1, further comprising:
receiving a different command to access a different cache line, the different cache line corresponding to a different row of memory array elements of the plurality of memory array elements; and
responsive to determining that the different row of memory array elements does not match the row number that is associated with the defective memory array element, abstaining from activating any column shifters.

9. The computer-implemented method of claim 1, wherein a column shifter comprises a multiplexer configured to receive a first symbol provided by memory array elements of a first column of the plurality of columns and a second symbol provided by memory array elements of a second column of the plurality of columns, wherein the second column is logically adjacent to the first column.

10. The computer-implemented method of claim 1, wherein the one or more column shifters are dynamically controlled by control logic associated with the plurality of memory array elements based on the selected row of memory array elements corresponding to the cache line and the stored row number and column number that are associated with a defective memory array element.

11. The computer-implemented method of claim 1, wherein at least one of the one or more column shifters is coupled to two columns.

12. The computer-implemented method of claim 1, wherein at least one of the one or more column shifters is coupled to three columns, by having one output terminal coupled to the corresponding column, one input terminal coupled to the adjacent column, and another input terminal coupled to another adjacent column.

13. A system comprising:
a processor communicatively coupled to a memory, the processor configured to:
store a row number and a column number that are associated with a defective memory array element of a plurality of memory array elements, wherein the plurality of memory array elements are logically arranged in a plurality of rows and a plurality of columns;
receive a command to access a cache line, the cache line corresponding to a selected row of memory array elements of the plurality of memory array elements; and
responsive to determining that the selected row matches the row number that is associated with the defective memory array element, activate, based on the column number that is associated with the defective memory array element, one or more column shifters to prevent access to the defective memory array element and provide access to a spare memory array element while accessing the cache line, the one or more column shifters each having an output terminal to a corresponding inline column of the plurality of columns, the one or more column shifters being disposed between each of the plurality of rows in the plurality of memory array elements;
wherein, upon receipt of input storage data designated for an adjacent column of the plurality of columns and receipt of corresponding data for the corresponding inline column both of which occur during storage operations, the one or more column shifters sequentially shifter the input storage data for storage away from the defective memory array element through one or more adjacent columns in the plurality of columns until reaching an associated column for the spare memory array element such that the input storage data designated for the adjacent column immediately prior to the spare memory element is shifted to and stored in the associated column for the spare memory array element;
wherein the spare memory array element is a single element, without requiring additional rows of spare memory array elements and without requiring additional columns of spare memory array elements, available for use in association with the plurality of memory array elements, the spare memory array element being connected to fetch and error correction circuitry.

14. The system of claim 13, wherein the command comprises a store command and activating the one or more column shifters to prevent access to the defective memory array element and provide access to the spare memory array element comprises:

for each column of the plurality of columns, activating a column shifter associated with the column in response to determining that a number of the column is greater than the column number that is associated with the defective memory array element.

15. The system of claim 14, wherein the processor is configured to store data in the spare memory array element.

16. The system of claim 13, wherein the processor is further configured to fetch data from the spare memory array element.

17. The system of claim 13, wherein a column shifter comprises a multiplexer configured to receive a first symbol provided by memory array elements of a first column of the plurality of columns and a second symbol provided by memory array elements of a second column of the plurality of columns, wherein the second column is logically adjacent to the first column.

18. A computer program product comprising a computer readable storage medium having program instructions embodied therewith the program instructions executable by a computer processor to cause the computer processor to perform a method comprising:

storing a row number and a column number that are associated with a defective memory array element of a plurality of memory array elements, wherein the plurality of memory array elements are logically arranged in a plurality of rows and a plurality of columns;

receiving a command to access a cache line, the cache line corresponding to a selected row of memory array elements of the plurality of memory array elements; and responsive to determining that the selected row matches the row number that is associated with the defective memory array element, activating, based on the column number that is associated with the defective memory array element, one or more column shifters to prevent access to the defective memory array element and provide access to a spare memory array element when accessing the cache line, the one or more column shifters each having an output terminal to a corresponding inline column of the plurality of columns, the one or more column shifters being disposed between each of the plurality of rows in the plurality of memory array elements;

wherein, upon receipt of input storage data designated for an adjacent column of the plurality of columns and receipt of corresponding data for the corresponding inline column both of which occur during storage operations, the one or more column shifters sequentially shift the input storage data for storage away from the defective memory array element through one or more adjacent columns in the plurality of columns until reaching an associated column for the spare memory array element such that the input storage data designated for the adjacent column immediately prior to the spare memory element is shifted to and stored in the associated column for the spare memory array element;

wherein the spare memory array element is a single element, without requiring additional rows of spare memory array elements and without requiring additional columns of spare memory array elements, available for use in association with the plurality of memory array elements, the spare memory array element being connected to fetch and error correction circuitry.

19. The computer program product of claim 18, wherein the command comprises a store command and activating the one or more column shifters to prevent access to the defective memory array element and provide access to the spare memory array element comprises:

for each column of the plurality of columns, activating a column shifter associated with the column in response to determining that a number of the column is greater than the column number that is associated with the defective memory array element.

20. The computer program product of claim 19, wherein the method further comprises storing data in the spare memory array element.

* * * * *